United States Patent [19]

Fujishima

[11] Patent Number: 4,586,171
[45] Date of Patent: Apr. 29, 1986

[54] SEMICONDUCTOR MEMORY

[75] Inventor: Kazuyasu Fujishima, Itami, Japan

[73] Assignee: Mitsubishi Denki Kabushiki Kaisha, Tokyo, Japan

[21] Appl. No.: 381,584

[22] Filed: May 24, 1982

[30] Foreign Application Priority Data

Jun. 15, 1981 [JP] Japan .................................. 56-92621

[51] Int. Cl.⁴ ............................................. G11C 13/00
[52] U.S. Cl. ...................................... 365/205; 365/63; 365/208; 365/230
[58] Field of Search ................... 365/63, 72, 205, 208, 365/230

[56] References Cited

U.S. PATENT DOCUMENTS

| | | | |
|---|---|---|---|
| 3,209,337 | 9/1965 | Crawford | 365/149 |
| 3,678,473 | 7/1972 | Wahlstrom | 365/149 |
| 3,771,148 | 11/1973 | Aneshausley | 365/149 |
| 4,025,907 | 5/1977 | Karp et al. | 365/149 |
| 4,160,275 | 7/1979 | Lee et al. | 365/205 |
| 4,287,576 | 9/1981 | Pricer | 365/208 |

OTHER PUBLICATIONS

"A 1-μm Mo-Poly 64-kbit MOS RAM", *IEEE Journal of Solid-State Circuits*, vol. SC-15, No. 4, Aug. 1980, pp. 667-671.
"One-Device Cells for Dynamic Random-Access Memories: A Tutorial"; *IEEE Transactions on Electron Devices*, Vol. ED-26, No. 6, Jun. 1979, pp. 839-852.

*Primary Examiner*—Terrell W. Fears
*Attorney, Agent, or Firm*—Lowe Price LeBlanc Becker & Shur

[57] ABSTRACT

A random access type semiconductor memory comprises a plurality of word lines (44; 54) of a metal arranged in parallel, at least first to fourth bit lines (BL1, BL2, BL1, BL2) orthogonal to the word lines, a plurality of memory cells (48; 58a, 58b), each of which is arranged corresponding to one of cross points between each of the word lines and each of the bit lines, a first sense amplifier (SA1) connected to the first and third bit lines (BL1, BL1) and a second sense amplifier (SA2) connected to the second and fourth bit lines (BL2, BL2). The first sense amplifier (SA1) amplifies a voltage applied to said first or third bit line from a selected first memory cell and the second sense amplifier (SA2) amplifies a voltage applied to the second or fourth bit line from a selected second memory cell.

13 Claims, 9 Drawing Figures

FIG. IA
PRIOR ART
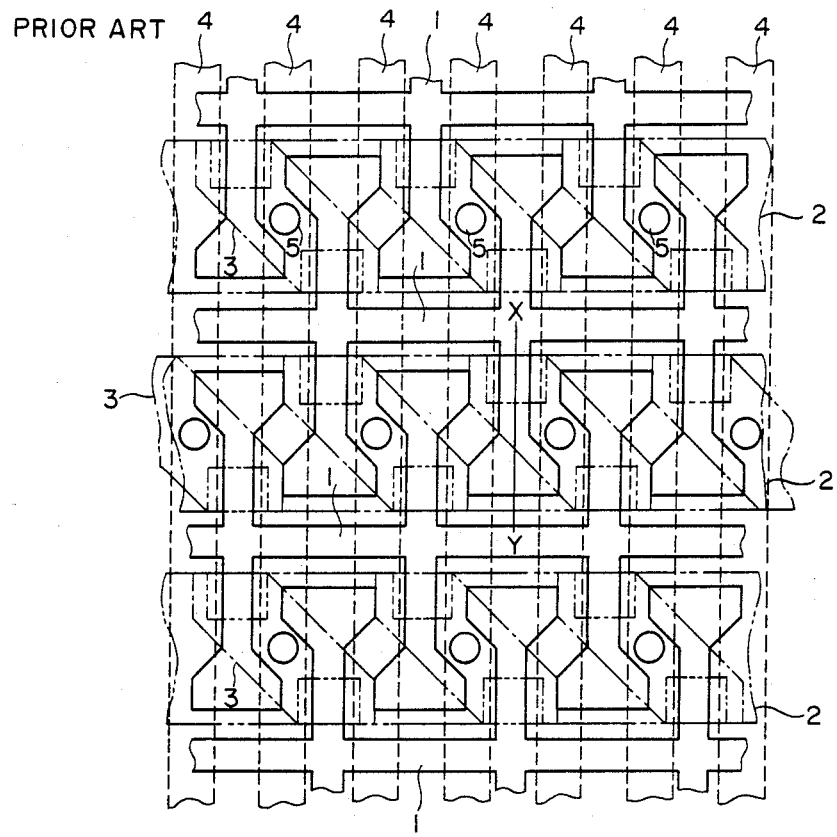
FIG. IB
PRIOR ART
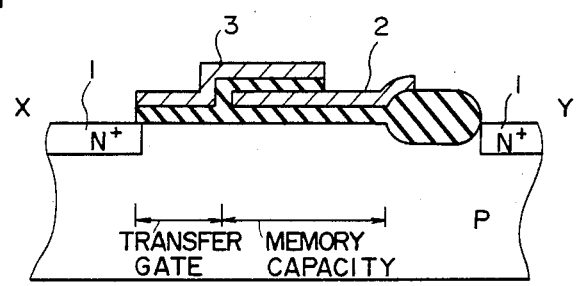

SEMICONDUCTOR MEMORY

BACKGROUND OF THE INVENTION

1. Field of the Invention

The present invention relates to a semiconductor memory and more particularly, relates to an arrangement of a memory array of a dynamic random access memory.

2. Description of the Prior Art

In a typical single transistor type of metal oxide semiconductor dynamic random access memory, the binary information "1" and "0" corresponds to the presence and absence of a charge to be stored in a metal oxide semiconductor capacitor, respectively. Such a semiconductor memory is adapted such that a charge stored in a metal oxide semiconductor capacitor is transferred to a bit line by turning a transfer gate on and a small change of the voltage caused at that time in the bit line by the presence or absence of the stored charge is detected by a sense amplifying circuit.

Since a plurality of bit lines and a plurality of word lines constituting transfer gates are closely disposed in a matrix manner in X and Y directions which are orthogonal to each other, selection of materials for these lines is a very important factor for constituting a memory array.

FIGS. 1A and 1B are a plan view and a cross sectional view, respectively, for explaining a prior art memory cell wherein a bit line is formed of an N+ diffusion region and a word line is formed of a metal. The memory cell comprises an N+ diffusion region 1 constituting a bit line, a first polysilicon layer 2 constituting a cell plate, a second polysilicon layer 3 constituting a transfer gate, an aluminium layer 4 constituting a work line, and a contact hole 5 for providing a word line signal to the transfer gate. Such structure has a shortcoming that the length of the transfer gate may often be different from transfer gate to transfer gate because self-alignment of the first and second polysilicon layers 2 and 3 is impossible or very difficult.

FIG. 2 shows an example of a memory array which is arranged by using memory cells shown in FIG. 1. Such a prior art memory array was necessarily of an open bit line structure wherein bit lines BL and bit lines $\overline{BL}$ are disposed on both sides of the sense amplifier circuit 6, respectively. More particularly, such an open bit line structure as shown in FIG. 2 comprises a plurality of sense amplifiers 6, a plurality of left word lines LWL disposed on the left side of the corresponding sense amplifier, a plurality of right word lines RWL disposed on the right side of the corresponding sense amplifiers. These word lines LWL and RWL are connected to the corresponding memory cell 8. The open bit line structure further comprises a pair of left dummy cells 7L, a pair of right dummy cells 7R, a left dummy word line LD and a right dummy word line RD. The dummy word lines LD and RD are connected to corresponding dummy cells 7L and 7R, respectively. The capacity of the dummy cells 7L and 7R are approximately half of the capacity of the memory cell. The contents of the memory cells 8 are read out by word signals on the word lines LWL and RWL. At the same time, the contents of the dummy cells 7L or 7R are read out by a word signal on a dummy word line LD or RD. These word signals are supplied from a word driving circuit 10. For example, if and when the information stored in the memory cell 8a is read out, word signals are applied from the word driving circuit 10 to the word line LWLa and the dummy word line RD. The outputs from the memory cell 8a and the dummy cell 7R are differentially amplified and detected by the sense amplifying circuit 6 (SA2). However, such open bit line structure has a disadvantage that it erroneously operates when a common mode noise is applied to only the left or right bit line.

FIGS. 3A and 3B are a plan view and a cross sectional view for explaining another prior art memory cell wherein a bit line is formed of an aluminium layer and a word line is formed of a polysilicon layer. Such memory cell comprises an aluminium layer 11 constituting a bit line, a first polysilicon layer 12 constituting a cell plate, a second polysilicon layer 14 constituting a word line and a contact hole 15 connecting a bit line to a memory cell. FIG. 4 shows an example of a memory array which is arranged by memory cells 18 shown in FIG. 3. This example is of a folded bit line structure wherein bit lines BL and bit lines $\overline{BL}$ are disposed on the same side of sense amplifying circuits 6. Thus, word lines WL, dummy word lines DW1 and DW2, bit cells 18 and dummy cells 17 are also disposed on the same side of the sense amplifying circuits 6. It is well-known that, as compared with an open bit line structure as shown in FIG. 2, the folded bit line structure is immune to a common mode noise and thus is suitable for a high density random access memory which is necessary to detect a small signal. On the other hand, in case where word lines 14 are formed of polysilicon layers 3 as shown in FIGS. 3 and 4, such folded bit line structure is not suitable for fast operation since an RC time constant of a polysilicon word line becomes larger than that of an aluminium word line. In order to avoid such problems, conventionally, a length of word line WL formed of a polysilicon layer 14 is made shorter by dividing a memory array, or a word line is formed of a metal having a high melting point, such as Mo. However, in the former approach, a chip size becomes very large and in the latter approach, mass production is very difficult.

For the purpose of decreasing imbalance of noise in a folded bit line structure, a double cells/1 bit or twin cell system has been proposed. FIG. 5 shows one example of such twin cell system. Such a twin cell system is adapted such that no dummy word lines are required and that if and when one word line is selected from a plurality of word lines WL formed of polysilicon layers 14, two memory cells 18a and 18b are selected which store data in a complementary manner per a signal sense amplifying circuit 6, the complementary data from these two memory cells 18a and 18b being transferred to bit lines BL and bit lines $\overline{BL}$ through equal bit line length and entered to the sense amplifying circuit 6. For this reason, the imbalance, such as a delay of signal and the like, between a word line and a dummy word line can be completely eliminated. Nevertheless, a prior example as shown in FIG. 5 is not suitable for a fast operation since an RC time constant of a polysilicon word line is relatively large.

SUMMARY OF THE INVENTION

The present invention comprises a semiconductor memory wherein a plurality of word lines are formed of a metal and arranged in parallel with each other in a predetermined direction, first through fourth bit lines are arranged in parallel with each other in a direction generally orthogonal to said predetermined direction, and including a plurality of memory cells. Each of the memory cells is arranged corresponding to one of a plurality of cross points between each of the word lines and each of the bit lines. The semiconductor memory further includes a first sense amplifier connected to the first and third bit lines for amplifying a voltage applied to the first or third bit line from a selected first memory cell, and a second sense amplifier connected to the second and fourth bit lines for amplifying a voltage applied to the second or fourth bit line from a selected second memory cell.

In a preferred embodiment of the present invention, the first amplifier is disposed at one end of each bit line and the second sense amplifier is disposed at the other end of each bit line.

In a more preferred embodiment of the present invention, a memory cell connected to the first bit line and a memory connected to the third bit line constitute a single bit and a memory cell connected to the second bit line and a memory cell connected to the fourth bit line constitute a single bit.

Accordingly, a principal object of the present invention is to provide a semiconductor memory comprising a memory array of a folded bit line structure wherein a word line is formed of a metal so that an RC time constant of a word line can be decreased.

Another object of the present invention is to provide a semiconductor memory which is immune to a common mode noise and is suitable for fast operation.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are a plan view and a cross sectional view for explaining a prior memory cell wherein a bit line is formed of an N+ diffusion region and a word line is formed of a metal;

DETAILED DESCRIPTION OF THE PREFERRED EMBODIMENT

Figure 6:
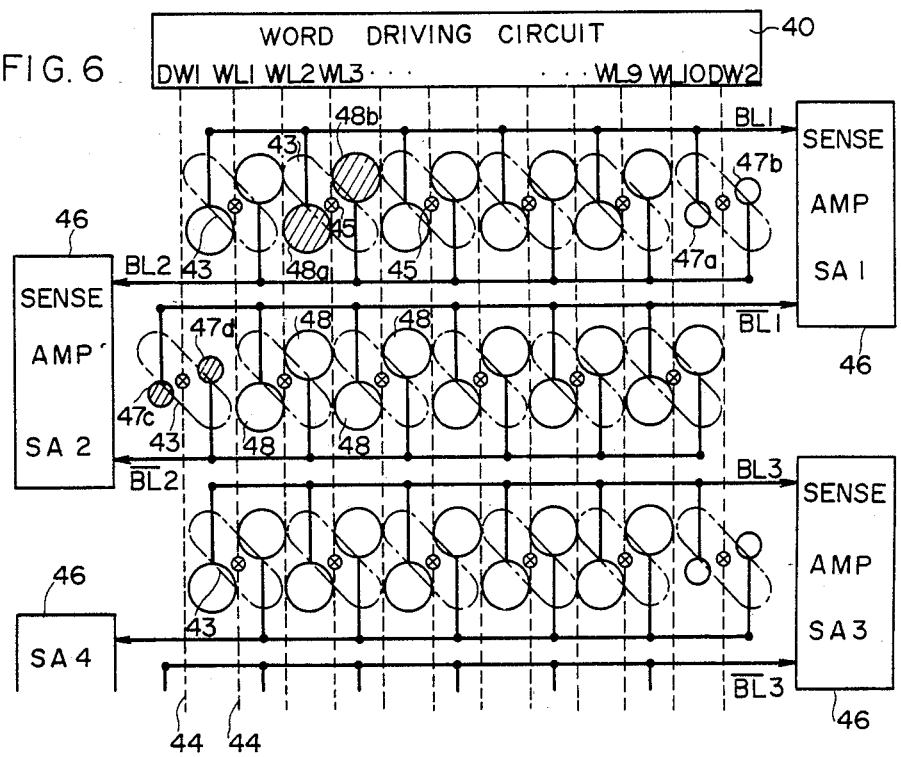
FIG. 6 is a diagram showing a memory array wherein word lines are formed of a metal layer and alternate bit lines are alternately connected to corresponding alternate sense amplifying circuits disposed on both sides.

FIG. 6 shows an example of a memory array folded bit line structure using a metal word line in accordance with the present invention. The present embodiment is characterized in that bit lines BL are alternately connected to the left and right sense amplifying circuits 46. It can be understood that memory cell information and dummy cell information are correctly transferred to a pair of bit lines BL and $\overline{BL}$ which are folded with respect to a sense amplifying circuit 46 disposed on a left side or a right side by selecting a single word line WL and a left or a right dummy word line DW1 or DW2.

Figure 2:
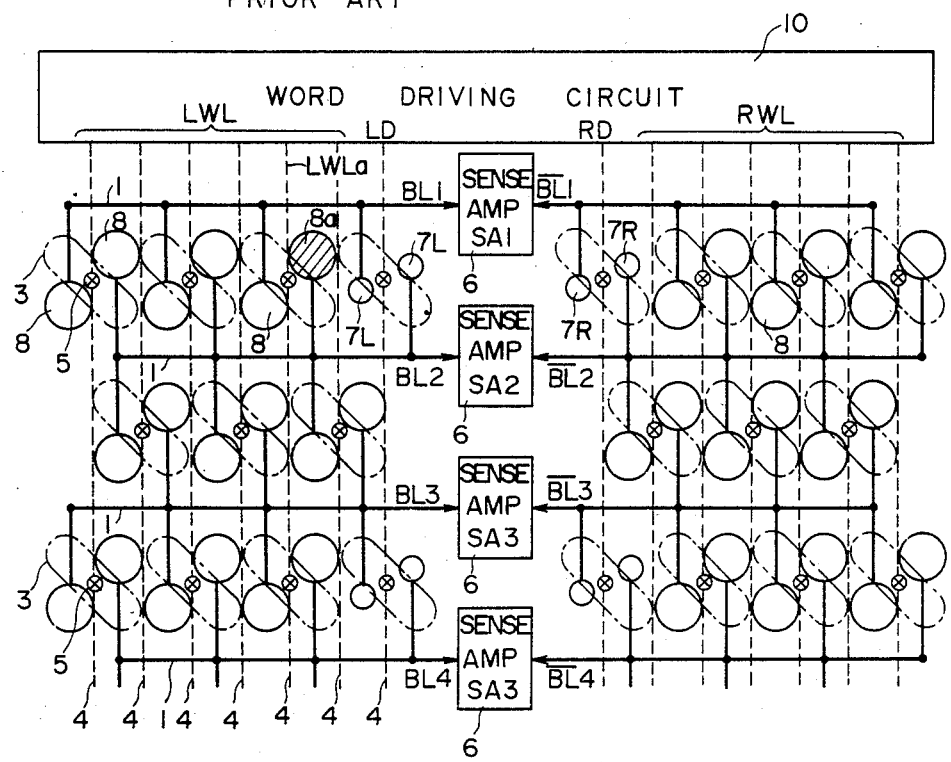
FIG. 2 is a diagram showing a prior memory array arranged by using memory cells shown in FIG. 1.
Figure 3A:
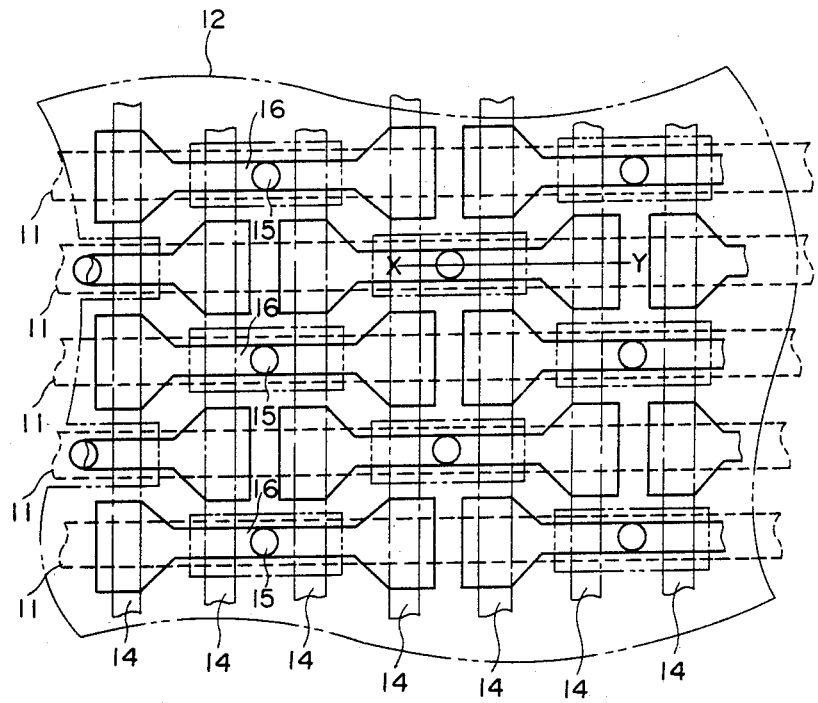
FIGS. 3A and 3B are a plan view and a cross sectional view for explaining a prior memory cell wherein a bit line is formed of a metal and a word line is formed of a polysilicon.
Figure 3B:
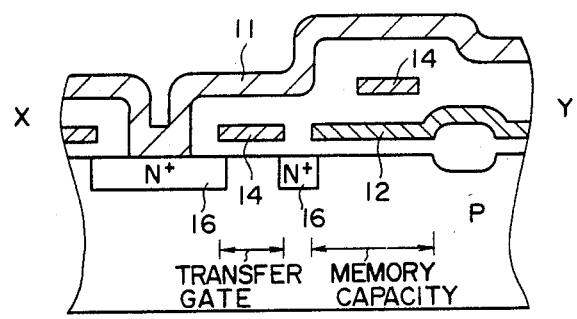
Figure 4:
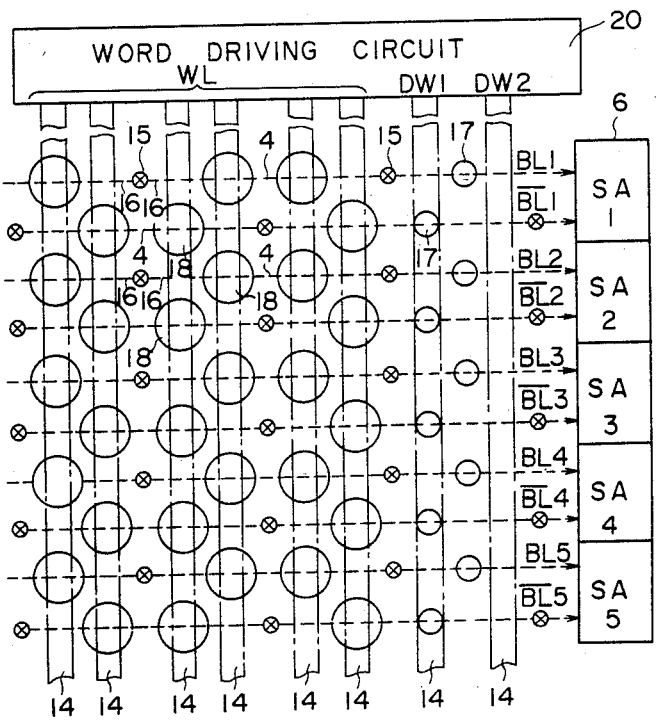
FIG. 4 is a diagram showing a prior memory array arranged by using memory cells shown in FIG. 3.
Figure 5:
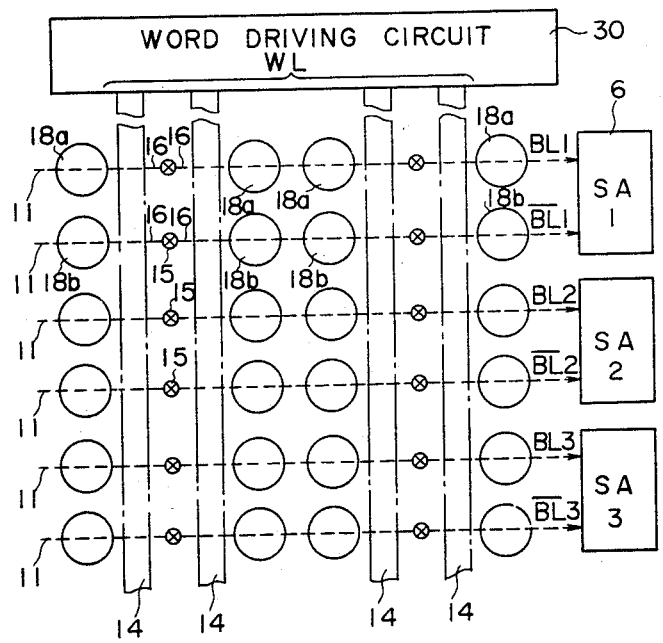
FIG. 5 is a diagram showing a prior example of a memory array arranged in a twin cell manner.

More particularly, the FIG. 6 embodiment includes a plurality of word lines WL, for example WL1 to WL10, which are formed of a metal and are arranged in parallel with each other in a vertical direction, and at least first through fourth bit lines BL1, $\overline{BL1}$, BL2 and $\overline{BL2}$ which are formed of an N+ diffusion region and are arranged in parallel with each other in a direction generally orthogonal to the direction of the word lines WL, that is, in a horizontal direction. A plurality of memory cells 48 are formed, each of which is arranged corresponding to one of cross points between each of the word lines WL1 to WL10 and each of the bit lines BL1, $\overline{BL1}$, BL2 and $\overline{BL2}$. Basic structure per se of a memory cell and the memory cell array are substantially the same as shown in FIGS. 1 and 2 except for the specific connection and array in the FIG. 6 embodiment. The basic structure of FIG. 6 thus includes contact holes 45 for making contact between the metal wordlines WL and transfer gates 43 formed in a polysilicon layer. The FIG. 6 embodiment further includes at least first and second sense amplifier SA1 and SA2, the first sense amplifier SA1 being disposed on one side of the memory cells and the second sense amplifier SA2 being disposed on the other side of the memory cells. In the FIG. 6 embodiment, the first and third bit lines BL1 and $\overline{BL1}$ are connected to the first sense amplifier SA1, whereas the second and fourth bit lines BL2 and $\overline{BL2}$ are connected to the second sense amplifier SA2. As a matter of course, the third amplifier SA3 may be provided on the same side as the first sense amplifier SA1 and the fourth amplifier SA4 may be provided on the same side as the second sense amplifier SA2, and the like. Correspondingly, the fifth and the seventh bit lines BL3 and $\overline{BL3}$ are connected to the third sense amplifier SA3, whereas the sixth and eighth bit lines BL4 and $\overline{BL4}$ (not shown) are connected to the fourth sense amplifier SA4. It should be noted that a pair of dummy cells 47a and 47b are provided between the first and second bit lines BL1 and BL2 and in the vicinity of the first sense amplifier SA1 and another pair of dummy cells 47c and 47d are provided between the third and fourth bit lines $\overline{BL1}$ and $\overline{BL2}$ and in the vicinity of the second sense amplifier SA2. The pair of dummy cells 47a and 47b are associated with a dummy word line DW2 and another pair of dummy cells 47c and 47d are associated with a dummy word line DW1. A word driving circuit 40 is adapted such that if and when one of the odd word lines WL1, WL3, WL5, . . . WL9 is selected, then the dummy word line DW1 is selected and if and when one of the even word lines WL2, WL4, . . . WL10 is selected, the dummy word line DW2 is selected.

In operation, assuming that the word line WL3 is selected and thus the dummy word line DW1 is selected by the word driving circuit 40, an appropriate voltage is applied through a hole contact 45 and thus the corresponding transfer gate 43 is enabled. Correspondingly, the information stored in the memory cells 48a and 48b is transferred to the first and second sense amplfiers SA1 and SA2, through the bit lines BL1 and BL2, respectively, whereas the information stored in the dummy cells 47c and 47d is transferred to the first and second sense amplifiers SA1 and SA2, through the bit lines $\overline{BL1}$ and $\overline{BL2}$, respectively. As a result, the information from the memory cell 48a and the information from the dummy cell 47c are differentially amplified and detected by the first sense amplifier SA1, while the information from the memory cell 48b and the information from the dummy cell 47d are also differentially amplified and detected by the second sense amplfier SA2.

Figure 7:
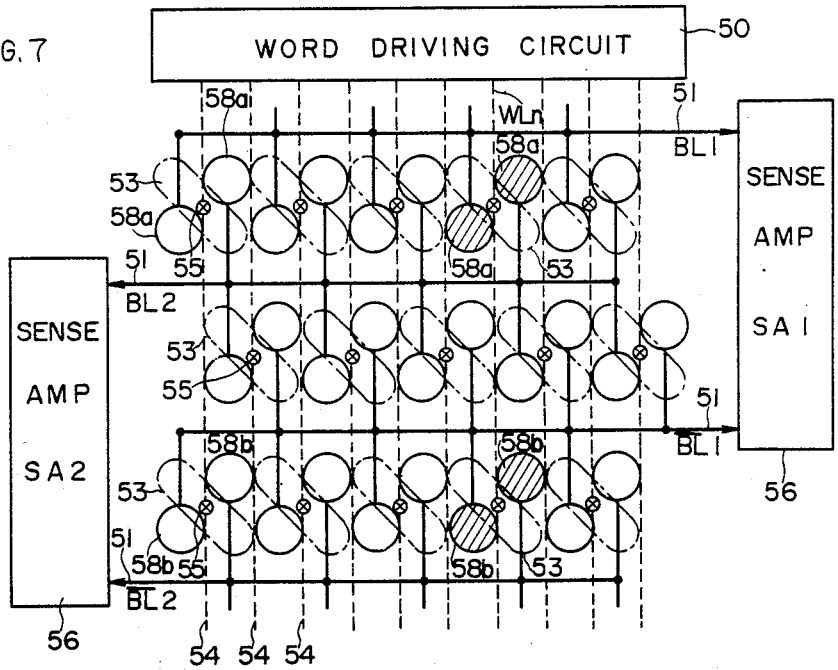
FIG. 7 is a diagram showing an embodiment wherein a memory array structure of the present invention is applied to a twin cell structure.

FIG. 7 shows another embodiment of the present invention wherein a folded bit line structure using a metal word line of the present invention is applied to a two cells/1 bit structure or twin cell structure. In this embodiment, basically, a plurality of bits are provided between the first and second bit lines BL1 and BL2, each bit being structured by a pair of memory cells 58a, and a plurality of bits are provided between the third and fourth bit lines BL1 and BL2, each bit being structured by a pair of memory cells 58b. If the word driving signal is applied to a word line WLn from a word driving circuit 50, then the data stored in one of the pair of memory cells 58a and the data stored in one of the pair of memory cells 58b are transferred through the first bit line BL1 and the third bit line BL1, respectively, to the first sense amplifier SA1, and the data stored in the other of the pair of memory cells 58a and the data stored in the other of the pair of memory cells 58b are transferred through the second bit line BL2 and fourth bit line BL2, respectively, to the second sense amplifier SA2. The respective sense amplifiers SA1 and SA2 differentially amplify and detect the data. Although the FIG. 7 embodiment merely shows two sense amplifiers and four bit lines, it should be understood that the same is by way of illustration and example only. For example, it is readily understood that a plurality of bits provided between the second and third bit lines may be used in combination with another plurality of bits provided between the fifth and sixth bit lines (not shown), for example.

In the FIG. 7 embodiment, no dummy word line is required and thus a problem of imbalance between a word line and a dummy word line is not caused. In addition, since the word line WL is formed of a metal, an RC time constant thereof becomes smaller and thus is suitable for fast operation. Furthermore, since a pair of memory cells 58a and a pair of memory cells 58b which respectively constitute a single bit are closely disposed and the data from the pair of memory cells 58a and the data from the pair of memory cells 58b are entered to a common sense amplifying circuit 56 through alternate bit lines BL and $\overline{BL}$ having equal length, it can be understood that a variation of a gate length in a transfer gate which would be caused by a masking shift which is a shortcoming of overlapped gate structure as shown in FIG. 1B, can be electrically balanced. In addition, as another meritorious effect of the present embodiment, a variation between the voltages necessary for reading "1" and "0" due to a change of a precharge voltage can be compensated, even if, for the purpose of quickly transmitting the content of the memory cell to the bit lines, the structure of the present embodiment is incorporated into an intermediate potential precharge system in which a precharge voltage for a bit line is fed to approximately VDD/2.

As described in the foregoing, in accordance with the structures of the memory arrays as shown in FIGS. 6 and 7 to which the present invention is applied, a dynamic random access memory can be obtained which is immune to a commmon mode noise, and have a good balance and in addition, is suitable for a fast operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor folded bit line memory for a plurality of bits comprising:
   a plurality of word lines comprised of a metal and arranged in parallel with each other in a predetermined direction,
   at least first through fourth sequentially arranged bit lines arranged in parallel with each other and forming a plurality of folded bit line pairs in a direction generally orthogonal to said predetermined direction,
   a plurality of memory cells, each of which is arranged in correspondence with one of a plurality of cross points between each of said word lines and said bit lines,
   each of said bits being structured as an interconnected pair of first and second ones of said memory cells having signal path connections to said first and third bit lines or to said second and fourth bit lines for redundant storage of data in a complementary manner;
   first and second sense amplifying means connected to said first and third bit lines and to said second and fourth bit lines, respectively, thereby forming said first and third bit lines into one pair of folded bit lines and forming said second and fourth bit lines into another pair of folded bit lines, said sense amplifying means operable for amplifying a signal applied to said respective bit lines from selected first and second memory cells.

2. A semiconductor memory in accordance with claim 1 wherein said first sense amplifying means is disposed at one end of each bit line and said second sense amplifying means is disposed at the other end of each bit line.

3. A semiconductor memory in accordance with claim 1 including dummy bit structures each having a pair of dummy memory cells connected via different bit lines to different sense amplifying means.

4. A multi-bit folded bit line memory structure comprising:
   a plurality of two-cell bit structures;
   a plurality of sense amplifiers, alternate amplifiers located at opposite ends of a plurality of bit lines;
   each sense amplifier sensing signals on a corresponding pair of alternate bit lines;
   said bit structures arranged in a plurality of sets;
   differing cells of each of said bit structures of any single set having signal path connections to a particular pair of corresponding bit lines connected to different ones of a single pair of sense amplifiers.

5. A multi-bit folded bit line memory structure comprising:
   a plurality of folded bit line pairs;
   a plurality of two-cell bit structures;
   a plurality of sense amplifiers having corresponding terminals connected to opposite ends of alternate ones of a plurality of corresponding sequential bit lines thereby forming said folded bit line pairs as pairs of alternate ones of said corresponding bit lines;
   said bit structures arranged in two sets, differing cells of a first set of bit structures having signal path connections to consecutive coresponding bit lines connected to different sense amplifiers, respectively; and differing cells of a second set of bit structures having signal path connections to consecutive opposite bit lines connected to different sense amplifiers, respectively;

at least one bit line connected to cells of bit structure of different sets.

6. A twin cell multi-bit folded bit line memory structure including:

a plurality of folded bit line pairs;

at least 4 interleaved bit lines;

two memory cells per bit;

a pair of sense amplifying means associated with said bit lines;

each of said sense amplifying means exclusively connected to a pair of alternate bit lines thereby forming said folded bit line pairs as pairs of alternate ones of said bit lines;

said two memory cells of each bit having signal path connections to consecutive ones of said bit lines connected to different sense amplifying means.

7. A memory structure in accordance with claim 6 including dummy bit structures each having a pair of dummy memory cells connected via different bit lines to different sense amplifying means.

8. A semiconductor folded bit line memory for a plurality of bits comprising:

a plurality of word lines comprised of a metal and arranged in parallel with each other in a predetermined direction, a plurality of folded bit line pairs formed of at least first through fourth bit lines sequentially arranged in parallel with each other in a direction generally orthogonal to said predetermined direction, a plurality of memory cells, each of which is arranged in correspondence with one of a plurality of cross points between each of said word lines and said bit lines, each of said bits being structured as an interconnected pair of first and second ones of said memory cells having signal path connections to said first and third bit lines or to said second and fourth bit lines;

said word lines further comprising transfer gate means connected to pairs of said memory cells, first and second sense amplifying means having signal path connections to said first and third bit lines and to said second and fourth bit lines, respectively, thereby forming said first and third bit lines into one pair of folded bit lines and forming said second and fourth bit lines into another pair of folded bit lines, said sense amplifying means operable for amplifying a signal applied to said respective bit lines from selected first and second memory cells connected directly thereto, said first and second sense amplifying means disposed at opposite ends of said bit lines.

9. A semiconductor folded bit line memory structure as recited in claim 8 further comprising transfer gate means formed in a polysilicon layer and contact means for providing contact between said metal word lines and said transfer gate means.

10. A semiconductor folded bit line memory structure as recited in claim 6, further comprising a plurality of word lines comprised of a metal and arranged substantially perpendicularly to said bit lines, transfer gate means formed in a polysilicon layer and contact means for providing contact between said metal word lines and said transfer gate means.

11. A semiconductor folded bit line memory structure as recited in claim 5, further comprising a plurality of word lines comprised of a metal and arranged substantially perpendicularly to said bit lines, transfer gate means formed in a polysilicon layer and contact means for providing contact between said metal word lines and said transfer gate means.

12. A semiconductor folded bit line memory structure as recited in claim 4, further comprising a plurality of word lines comprised of a metal and arranged substantially perpendicularly to said bit lines, transfer gate means formed in a polysilicon layer and contact means for providing contact between said metal word lines and said transfer gate means.

13. A semiconductor folded bit line memory structure as recited in claim 1 further comprising transfer gate means formed in a polysilicon layer and contact means for providing contact between said metal word lines and said transfer gate means.

* * * * *